US011362080B2

(12) United States Patent
Mueller et al.

(10) Patent No.: US 11,362,080 B2
(45) Date of Patent: Jun. 14, 2022

(54) SEMICONDUCTOR ARRANGEMENT

(71) Applicant: Infineon Technologies AG, Neubiberg (DE)

(72) Inventors: Christian Robert Mueller, Schweinfurt (DE); Christoph Urban, Sassendorf (DE)

(73) Assignee: Infineon Technologies AG

( * ) Notice: Subject to any disclaimer, the term of this patent is extended or adjusted under 35 U.S.C. 154(b) by 167 days.

(21) Appl. No.: 16/697,444

(22) Filed: Nov. 27, 2019

(65) Prior Publication Data

US 2020/0176433 A1 Jun. 4, 2020

(30) Foreign Application Priority Data

Nov. 30, 2018 (EP) .................................... 18209447

(51) Int. Cl.
*H01L 25/18* (2006.01)
*H01L 23/538* (2006.01)
(Continued)

(52) U.S. Cl.
CPC .......... *H01L 25/18* (2013.01); *H01L 23/5386* (2013.01); *H01L 24/05* (2013.01);
(Continued)

(58) Field of Classification Search
CPC ..... H01L 25/18; H01L 23/5386; H01L 24/05; H01L 24/40; H01L 24/48; H01L 23/3675; H01L 24/45; H01L 24/49; H01L 2224/04034; H01L 2224/04042; H01L 2224/40137; H01L 2224/45124;
(Continued)

(56) References Cited

U.S. PATENT DOCUMENTS 5,856,913 A * 1/1999 Heilbronner ........ H01L 23/5387
361/760
2004/0089931 A1* 5/2004 Nakajima ........... H01L 23/4334
257/796

(Continued)

FOREIGN PATENT DOCUMENTS

KR 20180090127 A * 8/2018 ............. H01L 25/16
WO WO-2013046824 A1 * 4/2013 ......... H01L 23/4952
(Continued)

*Primary Examiner* — Hoang-Quan Ho
(74) *Attorney, Agent, or Firm* — Design IP

(57) ABSTRACT

A semiconductor arrangement includes at least one switching device, electrically coupled between a first terminal and a second terminal, at least one diode, coupled in parallel to the at least one switching device between the first terminal and the second terminal, at least one bonding pad, and at least one electrically connecting element. Each of the at least one electrically connecting element is arranged to electrically couple one of the at least one switching device to one of the at least one diode. Each electrically connecting element includes a first end, a second end, and a middle section, and for at least one of the electrically connecting element, the first end is mechanically coupled to the respective switching device, the second end is mechanically coupled to the respective diode, and the middle section is mechanically coupled to at least one of the at least one bonding pad.

24 Claims, 3 Drawing Sheets

(51) Int. Cl.
*H01L 23/00* (2006.01)
*H01L 23/367* (2006.01)
*H02M 7/5387* (2007.01)

(52) U.S. Cl.
CPC .............. *H01L 24/40* (2013.01); *H01L 24/48* (2013.01); *H01L 23/3675* (2013.01); *H01L 24/45* (2013.01); *H01L 24/49* (2013.01); *H01L 2224/04034* (2013.01); *H01L 2224/04042* (2013.01); *H01L 2224/40137* (2013.01); *H01L 2224/45124* (2013.01); *H01L 2224/48137* (2013.01); *H01L 2224/49171* (2013.01); *H01L 2924/1203* (2013.01); *H01L 2924/13055* (2013.01); *H01L 2924/13062* (2013.01); *H01L 2924/13064* (2013.01); *H01L 2924/13091* (2013.01); *H02M 7/5387* (2013.01)

(58) Field of Classification Search
CPC . H01L 2224/48137; H01L 2224/49171; H01L 2924/1203; H01L 2924/13055; H01L 2924/13062; H01L 2924/13064; H01L 2924/13091; H01L 2924/15787; H01L 2224/45105; H01L 2224/48011; H01L 2224/48139; H01L 2224/48227; H01L 2924/10272; H01L 25/072; H01L 23/49838; H01L 23/3735; H01L 2224/45014; H01L 2224/49113; H01L 25/16; H01L 23/49524; H01L 23/49575; H02M 7/5387

See application file for complete search history.

(56) References Cited

U.S. PATENT DOCUMENTS

2004/0188706 A1   9/2004   Chang et al.
2013/0134572 A1   5/2013   Lenniger et al.

FOREIGN PATENT DOCUMENTS

| WO | 2018029801 A1 | 2/2018 | |
|---|---|---|---|
| WO | WO-2018057454 A1 * | 3/2018 | ......... G06F 17/5036 |

* cited by examiner

SEMICONDUCTOR ARRANGEMENT

FIELD

The instant disclosure relates to a semiconductor arrangement, and in particular to a semiconductor arrangement for a power semiconductor module.

BACKGROUND

Power semiconductor module arrangements often include a base plate within a housing. At least one substrate is arranged on the base plate. A semiconductor arrangement including a plurality of controllable semiconductor components (e.g., two or more IGBTs in a half-bridge configuration) is usually arranged on at least one of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. The layout of the semiconductor arrangement is usually chosen such that electrical losses in the arrangement are kept at a minimum. Further, an unequal distribution of electrical losses within the power semiconductor module should be prevented. Even further, it is desirable to prevent thermal hot spots on the at least one substrate.

There is a need for an improved semiconductor arrangement with reduced electrical losses that has a distribution of electrical losses that is as equal as possible, and wherein thermal hot spots are prevented as far as possible.

SUMMARY

A semiconductor arrangement includes at least one switching device, electrically coupled between a first terminal and a second terminal, at least one diode, coupled in parallel to the at least one switching device between the first terminal and the second terminal, at least one bonding pad, and at least one electrically connecting element. Each of the at least one electrically connecting element is arranged to electrically couple one of the at least one switching device to one of the at least one diode. Each electrically connecting element includes a first end, a second end, and a middle section, and for at least one of the electrically connecting element, the first end is mechanically coupled to the respective switching device, the second end is mechanically coupled to the respective diode, and the middle section is mechanically coupled to at least one of the at least one bonding pad.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
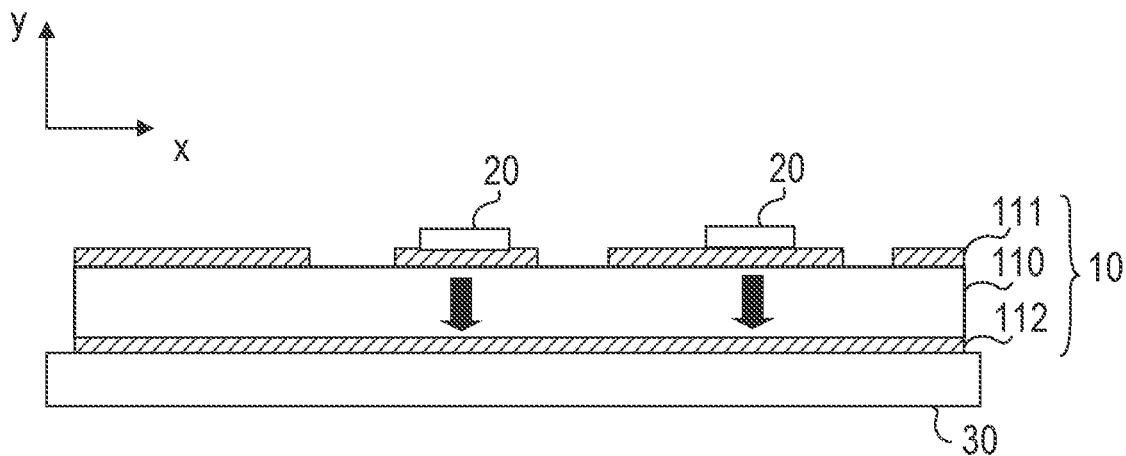
FIG. 1 illustrates a cross-sectional view of a semiconductor substrate arrangement.

FIG. 1 exemplarily illustrates a semiconductor substrate 10. The semiconductor substrate 10 includes a dielectric insulation layer 110, a first metallization layer 111 attached to the dielectric insulation layer 110, and a second metallization layer 112 attached to the dielectric insulation layer 110. The dielectric insulation layer 110 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 is a ceramic substrate, that is, a substrate in which the dielectric insulation layer 110 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 110 may consist of or include one of the following materials: $Al_2O_3$, AlN, or $Si_3N_4$. For instance, the substrate may, e.g., be a Direct Copper Bonding (DCB) substrate, a Direct Aluminium Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 µm and about 50 µm. The first metallization layer 111 of an IMS may be a comparably thin copper layer (e.g., thickness of between 35 µm and 500 µm), and the second metallization layer 112 may be a comparably thick aluminum or copper layer (e.g., thickness of between 0.6 mm and 2.0 mm), for example. The dielectric insulation layer 110 generally comprises a high insulation resistance while, at the same time, having a comparably low thermal conduction coefficient.

Usually one or more semiconductor bodies 20 are arranged on a semiconductor substrate 10. Each of the semiconductor bodies 20 arranged on a semiconductor substrate 10 may include a semiconductor component such as a diode, an IGBT (Insulated-Gate Bipolar Transistor), a MOS-FET (Metal-Oxide-Semiconductor Field-Effect Transistor), a JFET (Junction Field-Effect Transistor), a HEMT (High-Electron-Mobility Transistor), or any other suitable controllable semiconductor element. One or more controllable semiconductor components may form a semiconductor arrangement on the semiconductor substrate 10. In FIG. 1, two semiconductor bodies 20 are exemplarily illustrated. Any other number of semiconductor bodies 20, however, is also possible.

The semiconductor substrate 10 may be attached to a base plate or heat sink 30 with the second metallization layer 112 arranged between the dielectric insulation layer 110 and the base plate/heat sink 30. Heat that is generated by the semiconductor bodies 20 may be dissipated through the semiconductor substrate 10 to the base plate or heat sink 30. This is exemplarily illustrated by the bold arrows in FIG. 1. In the example of FIG. 1, only one substrate 10 is arranged on the base plate 30. This, however, is only an example. It is also possible that two or more substrates 10 are arranged on the same base plate 30.

The second metallization layer 112 of the semiconductor substrate 10 in FIG. 1 is a continuous layer. The first metallization layer 111 is a structured layer in the arrangement illustrated in FIG. 1. "Structured layer" means that the first metallization layer 111 is not a continuous layer, but includes recesses between different sections of the layer. Such recesses are schematically illustrated in FIG. 1. The first metallization layer 111 in this arrangement exemplarily includes four different sections. Different semiconductor bodies 20 may be mounted to the same or to different sections of the first metallization layer 111. Different sections of the first metallization layer 111 may have no electrical connection or may be electrically connected to one or more other sections using electrical connections such as, e.g., bonding wires. Electrical connections may also include connection plates or conductor rails, for example, to name just a few examples. This, however, is only an example. The first metallization layer 111 may comprise any number of sections. The first metallization layer 111 may also be a continuous layer.

The substrate 10 may also be a multi-layer substrate (not illustrated). A multilayer substrate, in addition to the first dielectric insulation layer 11, further comprises at least one additional dielectric insulation layer. The first metallization layer 111 may then be arranged between the first dielectric insulation layer 11 and an additional dielectric insulation layer. A third metallization layer may be formed on a top surface of the additional dielectric insulation layer. The first metallization layer 111 and the third metallization layer may be connected by means of vias which extend through the additional dielectric insulation layer. When using a multi-layer substrate, the semiconductor bodies 20 may be arranged on the third metallization layer, for example. According to another example, the multi-layer substrate may comprise more than one additional dielectric insulation layer, with additional metallization layers arranged between the different dielectric insulation layers.

Figure 2:
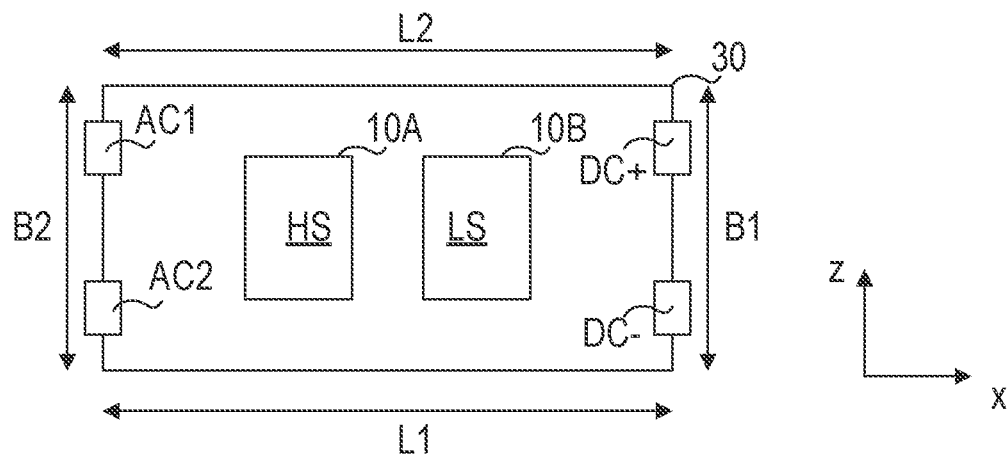
FIG. 2 schematically illustrates a top view of a semiconductor substrate arrangement in a power semiconductor module.

The semiconductor bodies 20 may form a semiconductor arrangement. For example, the semiconductor bodies 20 may comprise switching devices that are arranged in a half-bridge configuration. Such a semiconductor arrangement is exemplarily illustrated in FIG. 2. FIG. 2 illustrates a top view of a power semiconductor module arrangement. The power semiconductor module arrangement may comprise a base plate 30, as has been described with respect to FIG. 1 above. One or more semiconductor substrates 10A, 10B may be arranged on the base plate 30. A plurality of semiconductor bodies (not specifically illustrated in FIG. 2) may form a semiconductor arrangement on the at least one semiconductor substrate 10A, 10B. For example, each of the semiconductor bodies may comprise a controllable semiconductor component such as a switching device or a diode. One or more switching devices may be coupled between a first terminal DC+ and a second terminal AC. In particular, each of the switching devices may comprise a control electrode and a controllable load path, the load paths of the different switching devices being operatively connected in parallel and between the first terminal DC+ and the second terminal AC. The first terminal DC+ may be configured to be coupled to a first electrical potential, and the second terminal AC may be configured to be coupled to a load (not illustrated). The first potential may be a positive potential. The switching devices, therefore, may be referred to as high side switches HS. One or more additional switching devices may be coupled between the second terminal AC and a third terminal DC−. In particular, each of the additional switching devices may comprise a control electrode and a controllable load path, the load paths of the different switching devices being operatively connected in parallel and between the second terminal AC and the third terminal DC−. The third terminal DC− may be configured to be coupled to a second electrical potential. The second potential may be a negative potential. The additional switching devices, therefore, may be referred to as low side switches LS.

Still referring to FIG. 2, the power semiconductor module may have a rectangular cross-section and may comprise a first longitudinal side L1, a second longitudinal side L2, a first narrow side B1, and a second narrow side B2. The first and the third terminal DC+, DC− may both be arranged on the first narrow side B1 of the power semiconductor module, for example. The second terminal AC may be arranged on the second narrow side B2 of the power semiconductor module. In the example of FIG. 2, the third terminal AC comprises two taps AC1, AC2 that are electrically coupled to each other. This, however, is only an example. The third terminal AC may comprise any number x of taps, with x≥1.

In the semiconductor arrangement of FIG. 2, the high side switches HS form a first group of switching devices that is arranged on a first half of the power semiconductor module. The low side switches LS form a second group of switching devices that is arranged on a second half of the power semiconductor module. Individual switching devices as well as electrical connections between the high side and low side switches HS, LS and the terminals DC+, DC−, AC are not specifically illustrated in FIG. 2.

Figure 3:
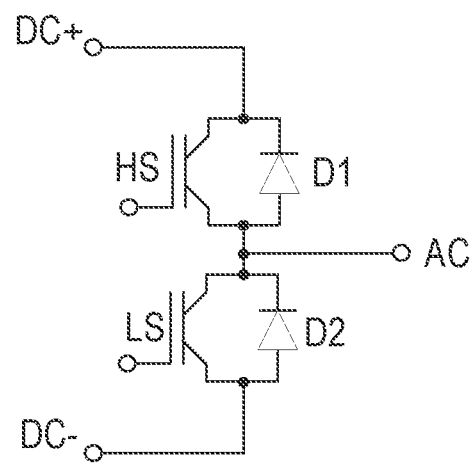
FIG. 3 schematically illustrates a circuit diagram of a half bridge arrangement.

An exemplary circuit diagram of a half-bridge arrangement is schematically illustrated in FIG. 3. As has been described before, a high side switch HS is coupled between the first terminal DC+ and the second terminal AC, and a low side switch LS is coupled between the second terminal AC and the third terminal DC−. The switching devices HS, LS are implemented as IGBTs in the example of FIG. 3. Each of the IGBTs comprises a collector, an emitter, and a gate. The collector of the high side switch HS is coupled to the first terminal DC+, the emitter of the high side switch HS is coupled to the second terminal, the collector of the low side switch LS is coupled to the second terminal AC, and the emitter of the low side switch LS is coupled to the third terminal DC−. Each of the switching devices HS, LS has a diode D1, D2 coupled in parallel between the respective terminals DC+, AC, DC−. A cathode of a diode D1, D2 may be coupled to the same node as the collector of the respective switch, and an anode of a diode D1, D2 may be coupled to the same node as the emitter of the respective switch. In the example of FIG. 3, the high side switch HS is implemented with a single IGBT, and the low side switch LS is implemented with a single IGBT. It is, however, also possible to implement each of the high side switch HS and the low side switch LS with a plurality of IGBTs (not illustrated). The high side switch HS may generally be implemented by a first plurality n of individual switching devices HSn, with n≥2, and the low side switch LS may generally be implemented by a second plurality m of individual switching devices LSm, with m≥2. The plurality of high side switches HSn may be coupled in parallel to each other between the first terminal DC+ and the second terminal AC, and the plurality of low side switches LSm may be coupled in parallel to each other between the second terminal AC and the third terminal DC−.

The half bridge arrangement of FIGS. 2 and 3 is only an example. Generally, controllable semiconductor devices may be arranged in any kind of configuration. In particular, any number of controllable semiconductor devices may be coupled in series between two terminals. One further example of a possible configuration is a neutral point clamped (NPC) structure. Each of the switching devices used to implement an NPC structure (or any other alternative structure) may be implemented by a plurality of individual switching devices. Further, each of the switching devices used to implement an NPC structure (or any other alternative structure) may have at least one diode coupled in parallel between the respective terminals.

In order to minimize ohmic and inductive losses in the semiconductor arrangement and to avoid thermal hot spots in the arrangement, the switching devices HSn, LSm and the corresponding diodes D1n, D2m may be arranged in the power semiconductor module in an advantageous manner. For example, a high symmetry within the semiconductor arrangement may be preferable. In particular, a highly symmetric current feed may be advantageous in many applications. By optimizing the arrangement of the switching devices HSn, LSm and the diodes D1n, D2m, an unequal distribution of electrical losses within the semiconductor arrangement may be prevented. Further, the heat that is generated by the switching devices HSn, LSm and the diodes D1n, D2m during operation of the semiconductor arrangement may be spread over the cross-sectional area of the power semiconductor module such that thermal hot-spots may be reduced or avoided. Generally speaking, rapid aging and premature damages of the power semiconductor module may be prevented.

In some applications where several semiconductor devices are coupled in parallel between two terminals, it may be advantageous that the thermal coupling of the devices that are connected in parallel to each other is as equal as possible between the devices. This is, because generally the lifetime of a power semiconductor module is defined by the lifetime of the weakest component. If one of the component is thermally burdened more than the other components, this component will most likely be the component with the shortest lifetime.

For many applications it may be advantageous to provide a certain area of the first metallization layer 111 in the vicinity of each component, which is not interrupted by recesses or other components. In many cases it is desirable that this area is as big as possible. In other words, it may be desirable that a distance between a component and a recess of the first metallization layer 111 is as large as possible. However, this needs to be weighed up with increased costs for an increased size of the power semiconductor module.

Many of the requirements and features described above may be especially important if fast switching devices are used within the power semiconductor module (as compared to slow switching devices).

Electrical connections between different semiconductor bodies as well as between semiconductor bodies and one or more sections of the first metallization layer 111 may be provided using bonding wires. Such bonding wires generally have a certain length to span the distance between different semiconductor devices or between a semiconductor device and a section of the first metallization layer 111. The length of each of the bonding wires may be as short as possible. This may be accomplished, e.g., by placing semiconductor devices that are to be electrically coupled by means of a bonding wire as close to each other as possible. This, however, is not always possible. Even further, placing different semiconductor devices too close to each other may cause certain disadvantages, such as thermal hot-spots, for example.

Figure 4:
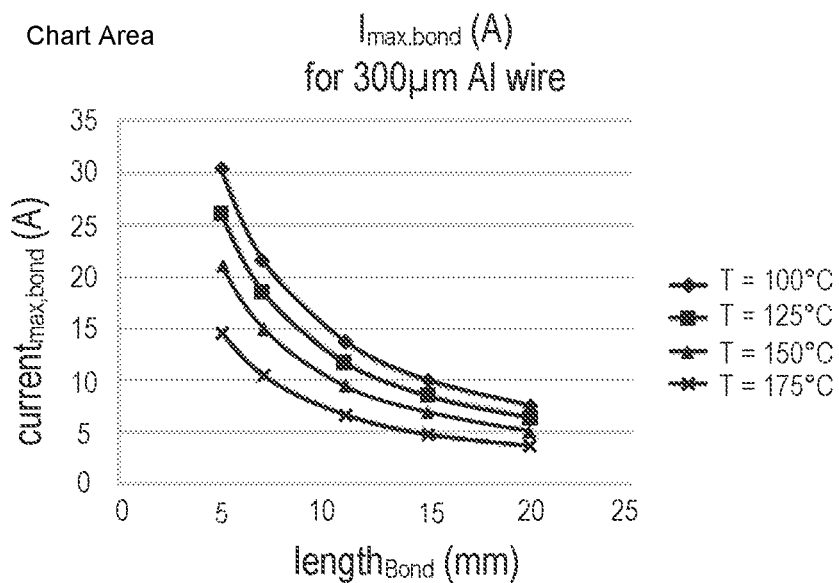
FIG. 4 schematically illustrates in a diagram a dependency of a current in a bonding wire for different lengths of the bonding wire at different temperatures.

Providing bonding wires that are as short as possible may be advantageous, because with increasing length of the bonding wire, the current carrying capacity of the bonding wire is reduced, and the (parasitic) inductance of the bonding wire is increased. The length of a bonding wire in this context is the free length of the bonding wire between two bonding connections. A bonding connection is a mechanical connection to a physical structure such as a semiconductor component or a conductor trace. The dependency of the current carrying capacity as a function of the length of a bonding wire is exemplarily illustrated in the diagram of FIG. 4. FIG. 4 illustrates a maximum current that may flow through the bonding wire for different lengths of the bonding wire. Different curves are illustrated for different temperatures of the bonding wire. The temperature has been measured at the ends of the bonding wire at the bonding connections. As can be seen for all of the different temperatures, the maximum current is considerably reduced at a length of the bonding wire of 20 mm as compared to a bonding wire having a length of only 5 mm. If, for example, the free length of the bonding wire is reduced from 20 mm to 10 mm, the maximum possible current essentially doubles. At higher temperatures this effect is slightly mitigated. It is, however, still significant. For the test setup that was used to generate the curves illustrated in FIG. 4, a bonding wire made of aluminum and having a diameter of 300 μm has been used. For other materials and diameters, however, the effect is similar.

Figure 5:
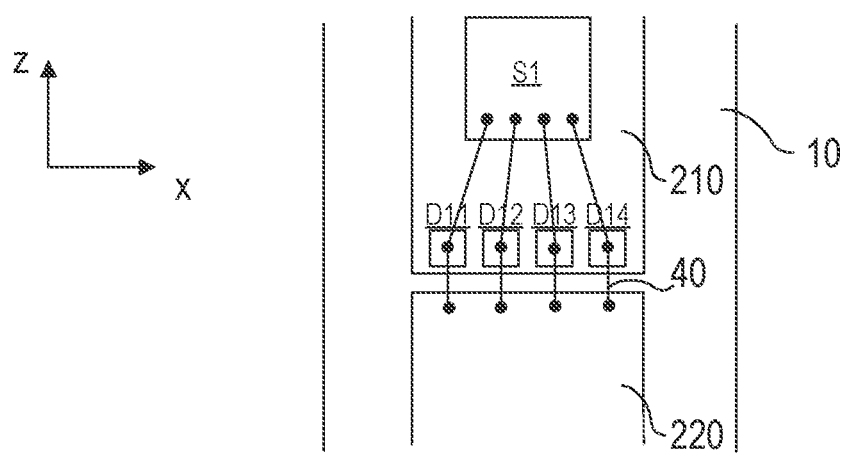
FIG. 5 schematically illustrates a top view of a semiconductor arrangement.

Now referring to FIG. 5, a typical semiconductor arrangement is schematically illustrated. In the arrangement of FIG. 5, a first conductor trace 210 and a second conductor trace 220 are provided on a semiconductor substrate 10. The first conductor trace 210 and the second conductor trace 220 may correspond to different sections of the first metallization layer 111. In general, more than two conductor traces 210, 220 may be provided on a semiconductor substrate 10. However, for illustration purposes, only two conductor traces 210, 220 are illustrated in FIG. 5. The first conductor trace 210 may be electrically coupled to the first terminal DC+, for example. This, however, is only an example. It is also possible that the first conductor trace 210 is electrically coupled to the second terminal AC, or to the third terminal DC−. The second conductor trace 220 may be electrically coupled to another one of the terminals. For example, if the first conductor trace 210 is electrically coupled to the first terminal DC+, the second conductor trace 220 may be coupled to the second terminal AC. If the first conductor trace 210 is electrically coupled to the second terminal AC, the second conductor trace 220 may be electrically coupled to the third terminal, for example.

In the example illustrated in FIG. 5, four diodes D11, D12, D13, D14 are electrically coupled in parallel to a switching device S1 between the respective terminals. On their bottom side (in a vertical direction y), the diodes D11, D12, D13, D14 and the switching device S1 are electrically coupled to the first conductor trace 210. On their top side (in the vertical direction y, the top side facing away from the semiconductor substrate 10), the diodes D11, D12, D13, D14 are each electrically coupled to the switching device S1 and to the second conductor trace 220. Bonding wires 40 are used to provide the electrical connections on the top side of the components. The arrangement illustrated in FIG. 5 physically appears to be highly symmetrical. The length of each of the different bonding wires between the switching device S1 and each of the diodes D11, D12, D13, D14 essentially equals each of the lengths of the other bonding wires, That is, a length of the bonding wire between the switching device S1 and the first diode D11 equals the length of the bonding wire between the switching device S1 and the second diode D12, the length of the bonding wire between the switching device S1 and the third diode D13, and the length of the bonding wire between the switching device S1 and the fourth diode D14.

The same applies for the bonding wires 40 between each of the diodes D11, D12, D13, D14 and the second conductor trace 220. That is, a length of a bonding wire between the first diode D11 and the second conductor trace 220 essentially equals a length of a bonding wire between the second diode D12 and the second conductor trace 220, a length of a bonding wire between the third diode D13 and the second conductor trace 220, and a length of a bonding wire between the fourth diode D14 and the second conductor trace 220. The individual bonding wires 40 may be implemented comparably short between the switching device S1 and each of the diodes D11, D12, D13, D14, as well as between each of the diodes D11, D12, D13, D14 and the second conductor trace 220. In this arrangement, the current distribution between the different components may be designed in a symmetrical way. However, the thermal distribution in this arrangement is poor. A spreading of the heat is mostly prevented in the arrangement of FIG. 5. Further, the lengths of the bonding wires 40 that are used to couple the switching device S1 to the different diodes D11, D12, D13, D14 may differ from the lengths of the bonding wires 40 that are used to couple the diodes D11, D12, D13, D14 to the second conductor trace 220.

Figure 6:
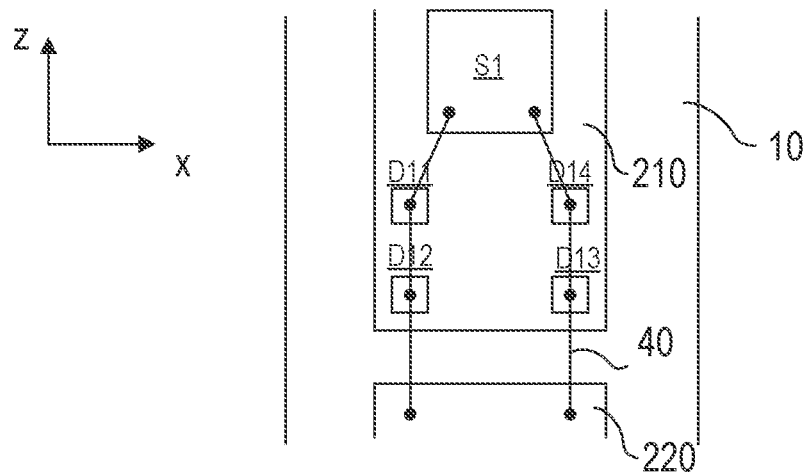
FIG. 6 schematically illustrates a top view of another semiconductor arrangement.

Now referring to FIG. 6, another typical semiconductor arrangement is schematically illustrated. In the semiconductor arrangement of FIG. 6, the thermal distribution has been optimized as compared to the arrangement of FIG. 5 by arranging the diodes D11, D12, D13, D14 in a different way. In the arrangement of FIG. 6, not all of the diodes D11, D12, D13, D14 are arranged next to each other in one row in a first horizontal direction x (as, e.g., in FIG. 5). Instead, the four diodes D11, D12, D13, D14 are arranged in the corners of a rectangle or a square. A first diode D11 and a fourth diode D14 are electrically coupled to the switching device S1 via bonding wires. In the example of FIG. 6, a direct connection is provided between the switching device S1 and the first diode D11, and between the switching device S1 and the fourth diode D14. A second diode D12 and a third diode D13 are not directly coupled to the switching device S1. A bonding connection is provided to electrically couple the second diode D12 to the first diode D11, and a further bonding connection is provided to electrically couple the third diode D13 to the fourth diode D14. The second diode D12 and the third diode D13 are each coupled to the second conductor trace 220 via a separate bonding wire 40. The lengths of the bonding wires 40 may be reduced in this arrangement as compared to the arrangement of FIG. 5. However, the lengths of the bonding wires 40 that are used to electrically couple the switching device S1 to the first diode D11 and to the fourth diode D14 may differ from the lengths of the bonding wires 40 that are used to electrically couple the first diode D11 to the second diode D12, and the third diode D13 to the fourth diode D14. The bonding wires 40 that electrically couple the second diode D12 and the third diode D13 to the second conductor trace 220 may have to carry twice the current as compared to the bonding wires electrically connecting the first diode D11 to the second diode D12, and the third diode D13 to the fourth diode D14 in this arrangement.

In the case of commutation, the first diode D11 and the fourth diode D14 have a higher inductance than the second diode D12 and the third diode D13. The arrangement of FIG. 6, therefore, is electrically asymmetric but provides a better thermal distribution as compared to the arrangement of FIG. 5.

Figure 7:
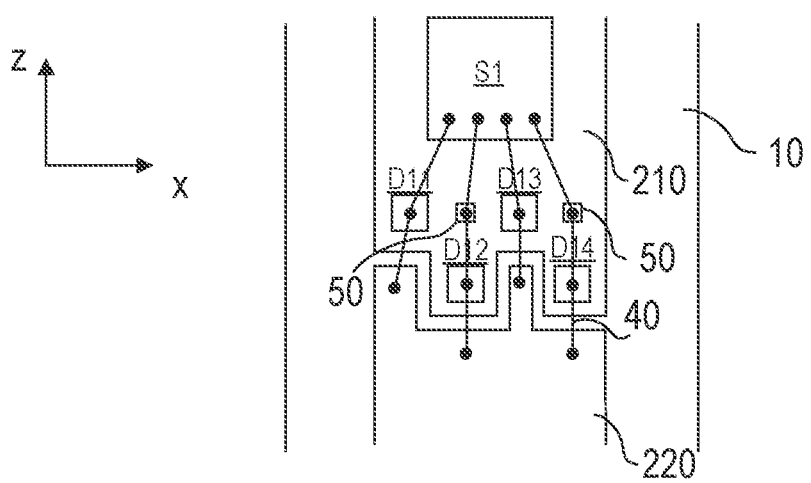
FIG. 7 schematically illustrates a top view of a semiconductor arrangement according to one example.

Now referring to FIG. 7, an exemplary semiconductor arrangement is provided which, on the one hand, is electrically symmetric to a high degree, and, on the other hand, provides a good thermal distribution. In the arrangement of FIG. 7, the diodes D11, D12, D13, D14 are arranged offset to their respective neighboring diodes in a first horizontal direction x as well as in a second horizontal direction z (neighboring diodes are arranged obliquely with respect to each other). The diodes D11, D12, D13, D14 in this way are arranged in a zig zag pattern or a checkered pattern). In other words, the diodes D11, D12, D13, D14 are arranged in two rows extending in the first horizontal direction x, wherein two subsequent diodes D11, D12, D13, D14 are arranged in different rows. This arrangement of the diodes D11, D12, D13, D14, however, is only an example. Generally, the diodes D11, D12, D13, D14 may be arranged in any other suitable way which contributes to an optimization of the thermal distribution.

A first one of the two rows is arranged closer to the switching device S1 than the second row. Each of the first and third diode D11, D13 arranged in the first row is directly coupled to the switching device S1 via a bonding wire. That is, no additional bonding connection is provided between the switching device S1 and the respective first and third diode D11, D13. The second and fourth diode D12, D14 that are arranged in the second row, on the other hand, are not directly connected to the switching device S1. Additional bonding pads 50 are provided between the switching device S1 and each of the second and fourth diode D12, D14 of the second row. For each of the second and fourth diode D12, D14 of the second row, an additional bonding connection is formed on the respective bonding pad 50. In this way, the free length of the respective bonding wires 40 may be reduced.

Each of the bonding wires 40 in the arrangement of FIG. 7 comprises a first end, a second end, and a middle section between the first and the second end. Each bonding wire of a first group of bonding wires may be mechanically coupled to the switching device S1 with its first end, and to a respective diode D11, D13 with its second end. The middle section of these bonding wires 40 of the first group does not comprise any further mechanical connections. Each bonding wire of a second group of bonding wires may be mechanically coupled to the switching device S1 with its first end, and to a respective diode D12, D14 with its second end. The middle section of each of the bonding wires of the second group may comprise an additional mechanical connection. In particular, the middle section of the bonding wires of the second group may be mechanically coupled to a respective one of the bonding pads 50.

Each of the bonding pads 50 is electrically insulated from each of the conductor traces 210, 220. According to one example, each of the bonding pads 50 comprises an electrically insulating material. For example, the bonding pads 50 may comprise a ceramic material. An electrically insulating bonding pad 50 may be arranged on an upper surface of the first conductor trace 210, for example. The upper surface of a conductor trace 210, 220 is a surface facing away from the semiconductor substrate 10. If a bonding wire 40 is bonded to an electrically insulating bonding pad 50, no electrical connection is established with any of the conductor traces. The bonding connection solely serves to reduce the free length of the bonding wire 40. It does not serve to provide an additional electrical connection.

According to another example, each of the bonding pads 50 may be formed by a separate section of the first metallization layer 111. That is, the bonding pads 50 may comprise an electrically conductive material. However, a recess is formed between each of the bonding pads 50 and other sections of the first metallization layer 111 (e.g., first conduction trace 210, second conduction trace 220). In this way, no electrical connection is provided between the bonding pads 50 and other sections of the first metallization layer 111 or any other components.

By reducing the free length of the bonding wires 40, the current carrying capacity of the respective bonding wires may be increased. The current carrying capacity of the bonding wires 40 electrically connecting the second diode D12 and the fourth diode D14 to the switching device S1 in this way may be better or at least equal to the current carrying capacity of the bonding wires 40 electrically connecting the first diode D11 and the third diode D13 to the switching device S1, even if a distance between the second and fourth diode D12, D14 and the switching device S1 is greater than a distance between the first and third diode D11, D13 and the switching device S1.

A temperature of the additional bonding connection on the bonding pads 50 may be equal to or less than a temperature at each of the first end and the second end of the respective bonding wire 40. If a temperature of the additional bonding connection increases the temperature at the first and second end of the respective bonding wire 40, this may result in an unwanted decrease of the current carrying capability of the bonding wire 40.

Each of the diodes D11, D12, D13, D14 is electrically coupled to the second conduction trace 220 via an individual bonding wire 40. The different bonding wires 40 electrically coupling the individual diodes D11, D12, D13, D14 to the second conduction trace 220 may have identical lengths. That is, a length of the bonding wire coupled between the first diode D11 and the second conduction trace 220 is equal to a length of a bonding wire coupled between the second diode D12 and the second conduction trace 220, to a length of the bonding wire coupled between the third diode D13 and the second conduction trace 220, and to a length of a bonding wire coupled between the fourth diode D14 and the second conduction trace 220.

The arrangement of FIG. 7, therefore, is at least partly symmetrical. In particular, the arrangement is symmetrical concerning the connections between the diodes D11, D12, D13, D14 and the second conduction trace 220. The arrangement, however, is asymmetric concerning the connections between the switching device and the diodes, with the first and the third diode D11, D13 being directly coupled to the switching device S1, and the second and the fourth diode D12, D14 not being directly coupled to the switching device S1. However, an asymmetry of the connections between the diodes D11, D12, D13, D14 and the switching device S1 is generally acceptable. The impacts of this partial asymmetry are generally rather small and negligible. Due to the identical lengths of the individual bonding wires between the diodes D11, D12, D13, D14 and the second conduction trace 220, however, the diodes D11, D12, D13, D14 have equal inductances and similar ohmic resistances in the case of commutation. This may be advantageous for many applications.

The stray inductances of the arrangement of FIG. 7 may be asymmetric, due to the different lengths of the bonding wires 40 coupling the diodes D11, D12, D13, D14 to the switching device. However, for many applications, this effect may be negligible with regard to the switching behavior of the switching device S1. In some cases, local overvoltages may arise due to asymmetric stray inductances in the bonding wires 40. However, such overvoltages may be diminished by a metallization on the top surface of the switching device S1 (top surface is a surface facing away from the semiconductor substrate 10).

The arrangement illustrated in FIG. 7, however, is only one example. In the example of FIG. 7, a plurality of diodes D11, D12, D13, D14 is electrically coupled in parallel to one switching device S1. It is, however, also possible that a plurality of switching devices is electrically coupled in parallel to each other as well as in parallel to one diode. In some applications, for example, a plurality of MOSFET devices (e.g., SiC MOSFET devices) may be electrically coupled in parallel to each other and in parallel to one (protective) diode. For example, each of the diodes D11, D12, D13, D14 in FIG. 7 may be replaced by a switching device Sn, and the switching device S1 of FIG. 7 may be replaced by a diode Dn. In this case, the switching devices Sn would be electrically coupled to the second conduction trace 220 by means of bonding wires 40. The diode Dn would be electrically coupled to the second conduction trace 220 via the switching devices. Any number of diodes ≥2 and any number of switching devices ≥2 is generally possible to form a partially symmetric arrangement.

Figure 8:
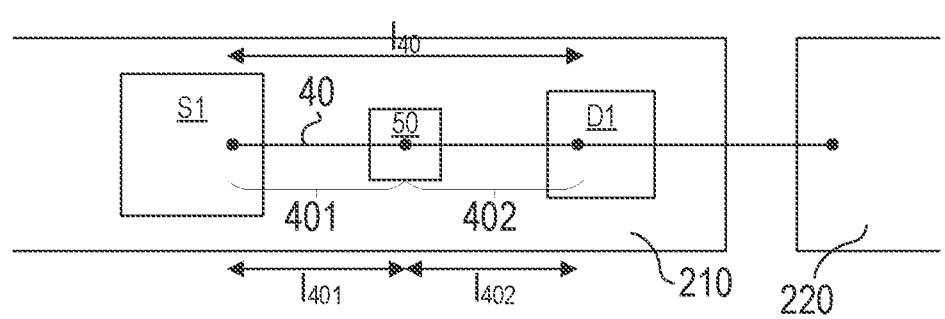
FIG. 8 schematically illustrates a top view of a semiconductor arrangement according to one example.

Generally, as is schematically illustrated in FIG. 8, a semiconductor arrangement may comprise at least one first controllable semiconductor component D1 (e.g., a switching device) and a second controllable semiconductor component S1 (e.g., a diode). The first controllable semiconductor component D1 and the second controllable semiconductor component S1 are electrically coupled to each other by means of a bonding wire 40. The bonding wire comprises a first end, a second end, and a middle section between the first end and the second end. The first end of the bonding wire 40 is mechanically coupled to the first controllable semiconductor component D1, and the second end of the bonding wire 40 is mechanically coupled to the second controllable semiconductor component S1. The middle section of the bonding wire 40 comprises an additional mechanical connection. In particular, the middle section may be mechanically coupled to a bonding pad 50. The bonding pad 50 may be arranged between the first controllable semiconductor component D1 and the second controllable semiconductor component S1. By providing this additional mechanical connection, the overall length 140 of the bonding wire 40 is reduced. In particular, the bonding wire 40 is divided into two different sections 401, 402, each of the two sections 401, 402 having a length 1401, 1402 that is less than the overall length 140 of the bonding wire 40. The bonding pad 50 may be electrically insulating or may be electrically coupled to the bonding wire 40 and electrically insulated from any other components of the semiconductor arrangement.

The length 1401 of the first section 401 of the bonding wire 40 may be equal to the length 1402 of the second section 402 of the bonding wire 40. In this way, the current carrying capability of the first section 401 may equal the current carrying capability of the second section 402. This, however, is only an example. It is also possible that the first and second section 401, 402 have different current carrying capabilities.

In the example of FIG. 8, only one bonding pad 50 is illustrated. That is, only one additional bonding connection is provided in the middle section of the bonding wire. However, it is also possible that more than one bonding pad 50 is arranged between the first controllable semiconductor component D1 and the second controllable semiconductor component S1. In this way, more than one additional bonding connection may be provided in the middle section of the bonding wire 40, and the bonding wire may be divided into three or more sections.

Bonding wires having essentially the same length may further have identical cross-sections and identical electrical properties. In particular, different bonding wires may be configured to provide identical voltage and current transfers.

A semiconductor arrangement may comprise any combination of switching devices and diodes, wherein switching devices within the same semiconductor arrangement may comprise different switching characteristics. This may require a symmetric distribution of the stray inductance.

A semiconductor arrangement may comprise any combination of switching devices and diodes, wherein switching devices within the same semiconductor arrangement may comprise equal switching characteristics. This may require a symmetric distribution of the stray inductance.

The invention has been described with respect to bonding wires above. This, however, is only an example. Any kind of connecting element may be used to electrically couple different components of a semiconductor arrangement. For example, bonding ribbons, brackets, clips, at least partially metallized connecting foils, or anything similar may be used instead of bonding wires.

What is claimed is:

1. A semiconductor arrangement, comprising:
a switching device electrically coupled between a first terminal and a second terminal;
a plurality of diodes coupled in parallel to the switching device between the first terminal and the second terminal, wherein the plurality of diodes are grouped into a first group of at least one diode and a second group of at least one diode, wherein the first group of at least one diode are obliquely arranged to the second group of at least one diode with respect to their respective distances from the switching device;
at least one first electrically connecting element, wherein each of the at least one first electrically connecting element directly couples a different diode of the first group of at least one diode to the switching device;
at least one bonding pad, wherein each of the at least one bonding pad is interposed between a different diode of the second group of at least one diode and the switching device; and
at least one second electrically connecting element, wherein each of the at least one second electrically connecting element couples a different diode of the second group of at least one diode to the switching device for making an electrical connection therebetween,
wherein each of the at least one second electrically connecting element comprises a respective first end mechanically coupled to the switching device, a respective second end mechanically coupled to a respective diode of the second group of at least one diode, and a respective middle section mechanically coupled to a different bonding pad of the at least one bonding pad.

2. The semiconductor arrangement of claim 1, further comprising:
a conductor trace to which the switching device and the plurality of diodes are electrically and mechanically coupled thereto,
wherein each of the at least one bonding pad is mechanically coupled to the conductor trace while further being electrically insulated from the conductor trace,
wherein each of the at least one bonding pad comprises an electrically insulating material that insulates from the conductor trace.

3. The semiconductor arrangement of claim 1, wherein:
each of the at least one first electrically connecting element comprises an overall free length; and
each of the at least one second electrically connecting element comprises at a first section extending from the first end to a respective bond pad and a second section extending from the second end to the respective bond pad, wherein the first section has a first section length that is less than the overall free length and the second section has a second section length that is less than the overall free length.

4. The semiconductor arrangement of claim 3, wherein:
the first section length and the second section length have identical lengths, and
a maximum current carrying capability of each of the at least one second electrically connecting element is determined by the identical lengths of the first section length and the second section length.

5. The semiconductor arrangement of claim 3, wherein:
the first section length and the second section length have different lengths, and
a maximum current carrying capability of each of the at least one second electrically connecting element is determined by a length of a longest one of the first section length and the second section length.

6. The semiconductor arrangement of claim 1, wherein:
the plurality of first diodes are linearly arranged with respect to each other in a first row that is displaced from the switching device by a first minimum distance and the plurality of second diodes are linearly arranged with respect to each other in a second row, wherein the first row is arranged between the switching device and the second row, and neighboring diodes of the plurality of diodes are arranged obliquely with respect to each other in different rows of the first row and the second row.

7. The semiconductor arrangement of claim 1, further comprising:
a first conductor trace to which the switching device and the plurality of diodes are electrically and mechanically coupled thereto;
a second conductor trace,
wherein each of the at least one first electrically connecting element electrically couples a respective diode of the first group of at least one diode to the second conductor trace, and
wherein each of the at least one second electrically connecting element electrically couples a respective diode of the second group of at least one diode to the second conductor trace.

8. The semiconductor arrangement of claim 7, wherein the second group of at least one diode includes a plurality of second diodes, and each of the at least one second electrically connecting element have identical lengths and are configured to provide identical voltage and current transfers between its respective diode of the second group of at least one diode and the second conductor trace.

9. The semiconductor arrangement of claim 7, wherein:
the first conductor trace is electrically coupled to the first terminal, and
the second conductor trace is electrically coupled to the second terminal.

10. The semiconductor arrangement of claim 1, wherein the switching device is a transistor.

11. The semiconductor arrangement of claim 1, wherein each of the first group of at least one diode is arranged at a first distance from the switching device and each of the second group of at least one diode is arranged at a second distance from the switching device that is greater than the first distance.

12. The semiconductor arrangement of claim 11, wherein each of the at least one bonding pad is arranged at the first distance from the switching device.

13. The semiconductor arrangement of claim 1, wherein:
each of the at least one first electrically connecting element has a first length, and
each of the at least one second electrically connecting element has a second length, the second length being greater than the first length.

14. The semiconductor arrangement of claim 1, wherein the first group of at least one diode includes a plurality of first diodes.

15. The semiconductor arrangement of claim 14, wherein the second group of at least one diode includes a plurality of second diodes.

16. The semiconductor arrangement of claim 15, wherein the plurality of first diodes are linearly arranged with respect to each other in a first row that is displaced from the switching device by a first minimum distance and the plurality of second diodes are linearly arranged with respect to each other in a second row that is displaced from the switching device by a second minimum distance that is different from the first minimum distance, wherein the first row is parallel to the second row.

17. The semiconductor arrangement of claim 14, wherein the at least one first electrically connecting element, arranged as parallel electrical paths with the at least one second electrically connecting element, is interleaved with the at least one second electrically connecting element in a first lateral direction.

18. The semiconductor arrangement of claim 1, wherein the first group of at least one diode and the second group of at least one diode are arranged in a zig-zag pattern or a checkered pattern with respect to their respective distances from the switching device.

19. A semiconductor arrangement, comprising:
a switching device electrically coupled between a first terminal and a second terminal;
a plurality of diodes coupled in parallel to the switching device between the first terminal and the second terminal, wherein the plurality of diodes includes a first diode and a second diode, and wherein the second diode is arranged obliquely to the first diode with respect to the switching device such that the second diode is offset from the first diode in both a first lateral direction and a second lateral direction that is orthogonal to the first lateral direction;
a first electrically connecting element that couples the first diode directly to the switching device;
a bonding pad interposed between the second diode and the switching device; and
a second electrically connecting element comprising a first end mechanically coupled directly to the switching device, a second end mechanically coupled directly to the second diode, and a middle section that is mechanically coupled directly to the bonding pad, wherein the second diode and the switching device are electrically coupled by the second electrically connecting element.

20. The semiconductor arrangement of claim 19, wherein the second electrically connecting element is longer than the first electrically connecting element such that the second diode is arranged at a greater distance from the switching device than the first diode.

21. The semiconductor arrangement of claim 19, wherein a current is configured to flow through the switching device in the second lateral direction.

22. The semiconductor arrangement of claim 21, wherein the bonding pad and the first diode are aligned with each other in the first lateral direction.

23. The semiconductor arrangement of claim 19, further comprising:
a conductor trace to which the switching device and the plurality of diodes are in direct electrical contact therewith,
wherein the bonding pad is mechanically coupled to the conductor trace while further being electrically insulated from the conductor trace.

24. The semiconductor arrangement of claim 23, wherein the bonding pad is configured to increase a current carrying capacity of the second electrically connecting element.

* * * * *